(12) United States Patent
Toyama et al.

(10) Patent No.: US 8,097,992 B2
(45) Date of Patent: Jan. 17, 2012

(54) ELECTRIC COMPRESSOR

(75) Inventors: Koji Toyama, Hiroshima (JP); Koji Nakano, Nagoya (JP); Takashi Nakagami, Nagoya (JP); Makoto Hattori, Kiyosu (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 599 days.

(21) Appl. No.: 12/212,832

(22) Filed: Sep. 18, 2008

(65) Prior Publication Data
US 2009/0087322 A1 Apr. 2, 2009

(30) Foreign Application Priority Data

Sep. 28, 2007 (JP) .................................. 2007-256554

(51) Int. Cl.
H02K 9/00 (2006.01)
(52) U.S. Cl. ........................................ 310/64; 310/68 R
(58) Field of Classification Search .................... 310/64, 310/68 R, 71, DIG. 6; 361/802; 417/410.1
See application file for complete search history.

(56) References Cited

U.S. PATENT DOCUMENTS

| | | | | |
|---|---|---|---|---|
| 4,554,473 A | * | 11/1985 | Muller | 310/67 R |
| 4,668,898 A | * | 5/1987 | Harms et al. | 318/400.21 |
| 5,825,107 A | * | 10/1998 | Johnson et al. | 310/64 |
| 6,081,056 A | * | 6/2000 | Takagi et al. | 310/89 |
| 6,198,183 B1 | * | 3/2001 | Baeumel et al. | 310/52 |
| 6,564,576 B2 | * | 5/2003 | Shibuya | 62/505 |
| 6,619,933 B2 | * | 9/2003 | Ikeda | 417/410.1 |
| 6,707,185 B2 | * | 3/2004 | Akutsu et al. | 310/71 |
| 7,021,075 B2 | * | 4/2006 | Shindo et al. | 62/259.2 |
| 7,122,928 B2 | * | 10/2006 | Shindo | 310/89 |
| 7,207,187 B2 | * | 4/2007 | Funahashi et al. | 62/228.4 |
| 2004/0197213 A1 | * | 10/2004 | Takemoto | 417/410.1 |
| 2009/0246047 A1 | * | 10/2009 | Hattori et al. | 417/410.1 |

FOREIGN PATENT DOCUMENTS

| | | | |
|---|---|---|---|
| JP | 2004190547 A | * | 7/2004 |
| JP | 2005036773 A | * | 2/2005 |
| JP | 3760887 B2 | | 1/2006 |
| JP | 2006316754 A | * | 11/2006 |

* cited by examiner

Primary Examiner — Quyen Leung
Assistant Examiner — Thomas Truong
(74) Attorney, Agent, or Firm — Westerman, Hattori, Daniels & Adrian, LLP

(57) ABSTRACT

The present invention has an object to provide an integrated electric compressor further downsized. An inverter control apparatus comprises: a power board 16 converting a direct current supplied from a high voltage power supply to an alternating current and applying it to a motor; and a control circuit board 15 controlling the application of the alternating current to the motor, wherein the power board 16 and the control circuit board 15 respectively have tall components 28 and 52 surface-mounted on one surfaces, which are relatively taller than components on the other surfaces, and the one surfaces face each other. The tall components 28 and 52 of the power board 16 and the control circuit board 15 are placed facing each other without interfering with each other in projection directions thereof.

14 Claims, 9 Drawing Sheets

ELECTRIC COMPRESSOR

BACKGROUND OF THE INVENTION

1. Field of the Invention

The present invention relates to an electric compressor having an electric motor driving a compression mechanism and an inverter control apparatus controlling the electric motor integrated with the compression mechanism and, more particularly, to an electric compressor whose inverter control apparatus includes a control circuit board and a power board.

2. Description of the Related Art

A vehicle-mounted air conditioner in an electric vehicle, a fuel cell electric vehicle or the like without mounting an engine has a compressor incorporating an electric motor as a power source that compresses and circulates a refrigerant. Since it is necessary for the electric motor to rotate at a desired rpm according to an instruction from a main control apparatus of the air conditioner, another control apparatus is required. The control apparatus includes an electric circuit or an electronic circuit. Specifically, the control apparatus includes an electronic element such as a central processing unit or a memory, and a switching element (power transistor element) such as an IGBT (Insulated Gate Bipolar Transistor) or an FET (Field Effect Transistor) for forming an inverter circuit (switching circuit). Then, there is an electric compressor having the control apparatus integrated into one housing with the compression mechanism and the electric motor because of a request for space saving. Hereinafter, the electric compressor may be mentioned as an integrated electric compressor.

Vehicle-mounted components such as integrated electric compressors are always required to be downsized and various proposals are made in view of the downsizing (for example, Japanese Patent No. 3760887).

Japanese Patent No. 3760887 has a main point of screwing a switching element to a base having a predetermined shape. The proposal of Japanese Patent No. 3760887 provides an integrated electric compressor capable of downsizing while still keeping shock resistance.

The present invention has an object to provide an integrated electric compressor further downsized.

SUMMARY OF THE INVENTION

In order to achieve the object, an electric compressor of the present invention comprises: a compression mechanism taking in, compressing and discharging a refrigerant; an electric motor driving the compression mechanism; an inverter control apparatus controlling a drive of the electric motor; and a housing accommodating the compression mechanism, the electric motor and the inverter control apparatus. Further, the inverter control apparatus of the present invention comprises: a power board converting a direct current supplied from a high voltage power supply to an alternating current and applying it to the motor; and a control circuit board controlling the application of the alternating current to the electric motor, wherein the power board has a first tall component surface-mounted on one surface, the first tall component is taller than a component on the other surface, the control circuit board has a second tall component surface-mounted on one surface, the second tall component is taller than a component on the other surface, and the one surface of the power board and the one surface of the control circuit board face each other. Further, it is characterized that the first tall component and the second tall component are placed facing each other without interfering with each other in projection directions thereof.

The electric compressor of the present invention can narrow a space between the power board and the control circuit board compared with the case where tall components of the power board and the control circuit board are piled up together because the second tall component is placed in a region where the first tall component does not exist, while the first tall component is placed in a region where the second tall component does not exist. As a result, lowering a height of the inverter control apparatus is achieved.

The electric compressor of the present invention can be formed of a bus bar in which power supply wiring for applying a voltage from the high voltage power supply to the power board is fixed to the power board. The bus bar is provided to a periphery of the power board and the control circuit board, and between the power board and the control circuit board. Accordingly, the first tall component and the second tall component and the bus bar are placed in the space between the power board and the control circuit board. Because of this, an outside diameter dimension of the inverter control apparatus can be substantially reduced up to an outside diameter dimension of the power board and the control circuit board.

For a configuration to further lower the height, the control circuit comprises a recess into which the first tall component is inserted at a location corresponding to the first tall component. Also, the power board comprises a recess into which the second tall component is inserted at a location corresponding to the second tall component. Then, a distal end of first tall component is inserted into the recess of the control circuit board and a distal end of the second tall component is inserted into the recess of the power board. As a result, lowering the height by a part or whole of thickness of the power board and the control circuit board can be realized. Here, a recess may be a through-hole or a blind hole.

In the present invention, it is preferable that the space between the power board and the control circuit board is filled with insulating gel to prevent the first and second tall components from dropping off.

According to the present invention, it is possible to lower a height of an inverter control apparatus obtained by combining a power board and a control circuit board. Accordingly, it is possible to downsize a part of a housing accommodating the inverter control apparatus, which contributes to downsizing and weight reducing the whole housing and further to reducing a cost thereof.

DETAILED DESCRIPTION OF THE PREFERRED EMBODIMENTS

Hereinafter, the present invention is described according to an embodiment shown in the appended drawings.

Figure 1:
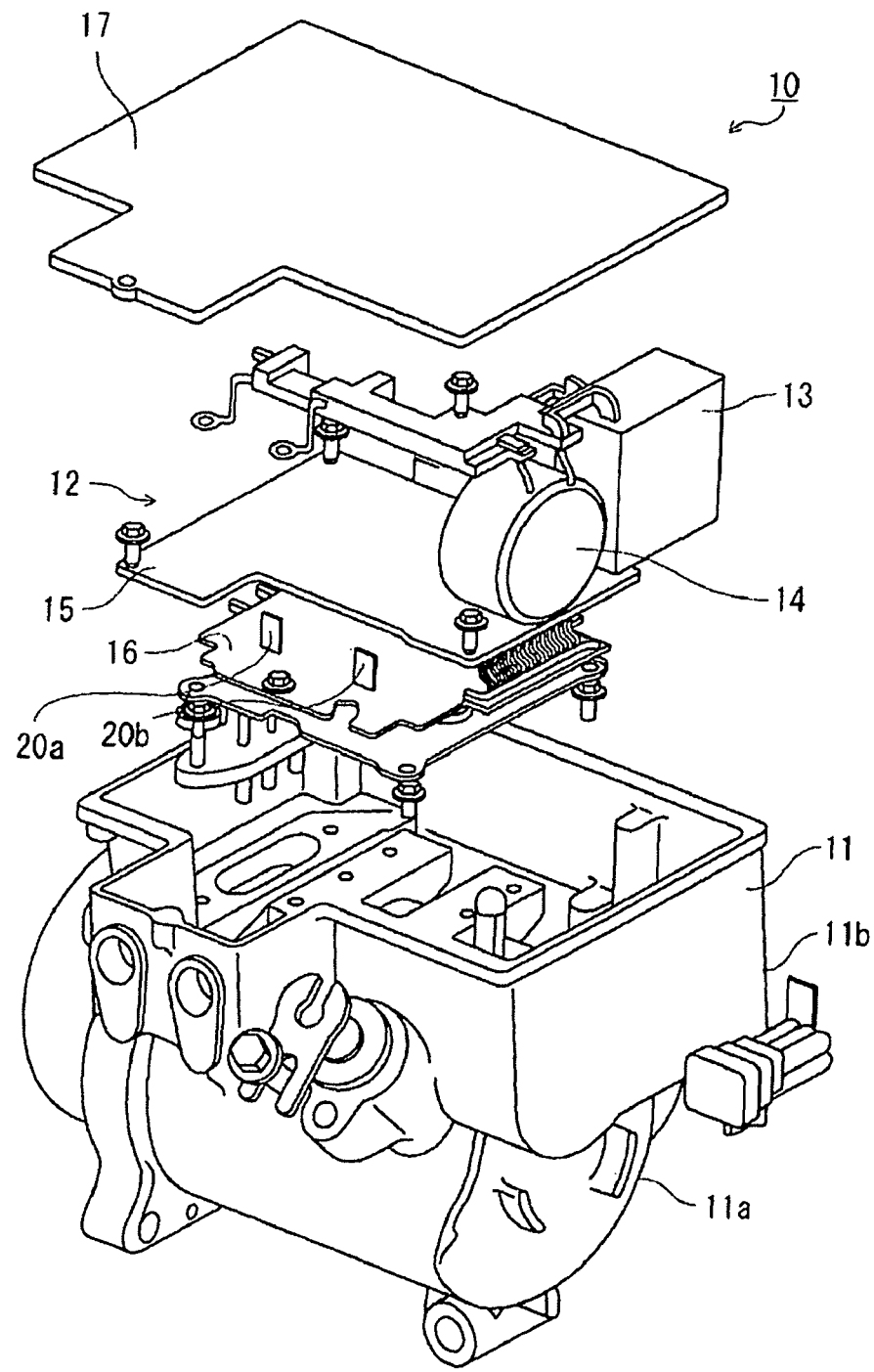
FIG. 1 is a view showing a whole configuration of an electric compressor in an embodiment.

FIG. 1 is an exploded perspective view showing a configuration of an electric compressor (an integrated electric compressor) 10 in the embodiment.

As shown in FIG. 1, the electric compressor 10 accommodates a motor (not shown) and a scroll compressor (not shown) taking in, compressing and discharging a refrigerant in a bottom container 11a of a housing 11, and accommodates an inverter control apparatus 12 in a top container 11b of the housing 11 which is open on the upper side. The opening of the top container 11b on the upper side is covered with a cover 17.

The inverter control apparatus 12 comprises: a capacitor 13 and a reactor 14 for smoothing a direct current voltage input to the inverter control apparatus 12; a control circuit board 15 for controlling an application of a high voltage alternating current to a motor; and a power board 16 converting a direct current supplied from a high voltage power supply to an alternating current, applying it to the motor, and rotating and driving the motor. The control circuit board 15 and the power board 16 are provided so as to face each other with a space between them.

Figure 2:
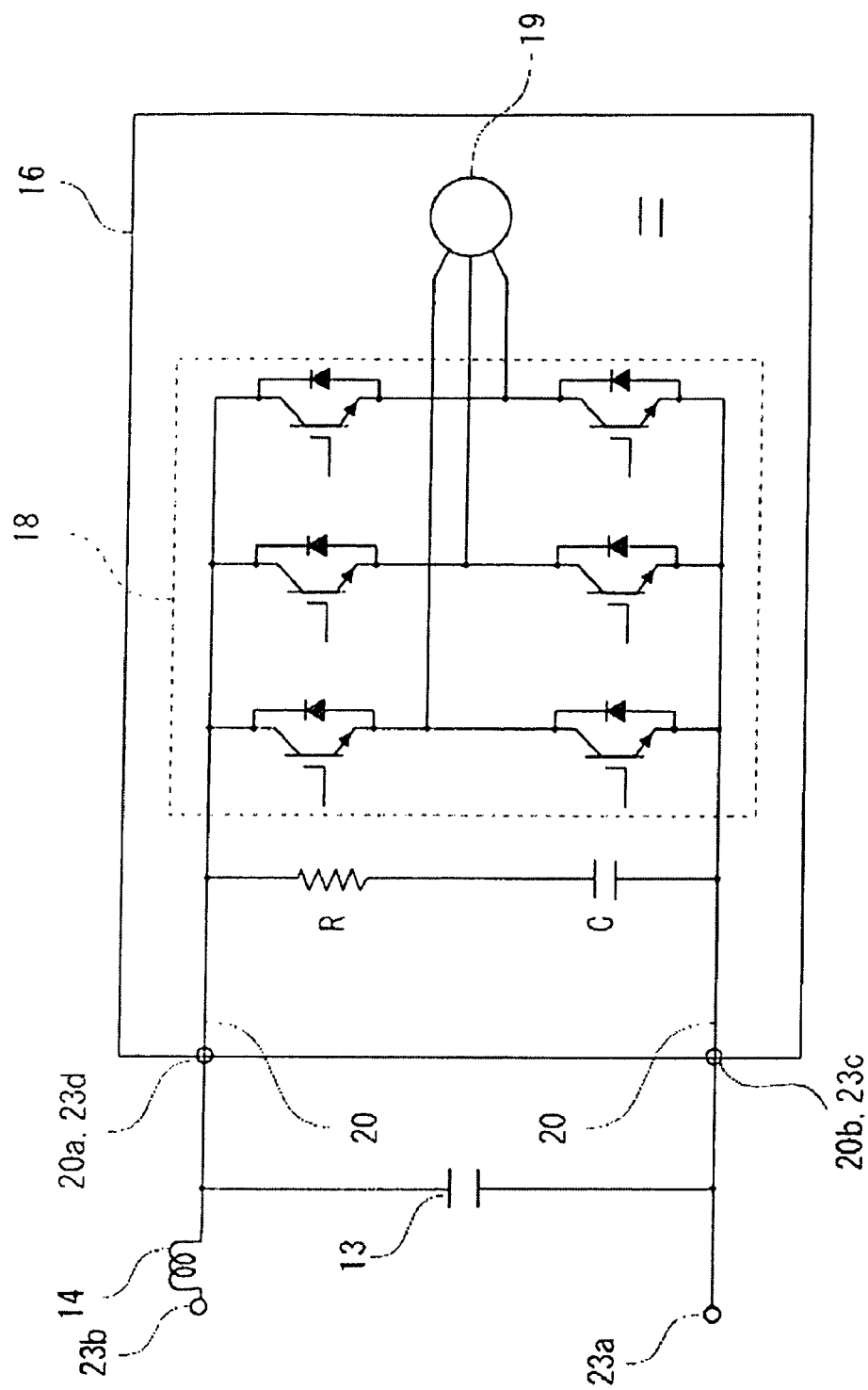
FIG. 2 is a diagram showing a circuit configuration of a power board.

FIG. 2 is a diagram showing a circuit configuration of the power board 16. A high voltage, for example, 300 V is supplied from an external high voltage power supply (not shown) to the power board 16. A switching element 18 including a plurality of IGBTs and a gate circuit (not shown) are mounted on the power board 16. A microcomputer for controlling an operation of the switching element 18 is provided to the control circuit board 15. A control signal of the microcomputer is transmitted from the control circuit board 15 to the power board 16 to drive the gate circuit, and the control signal is input to the switching element 18. Then the switching element 18 is operated. Because of this, a high voltage supplied from the high voltage power supply is turned into a three-phase current to be applied to a motor 19 of the electric compressor 10 so that the motor 19 is rotated and driven.

Figure 3:
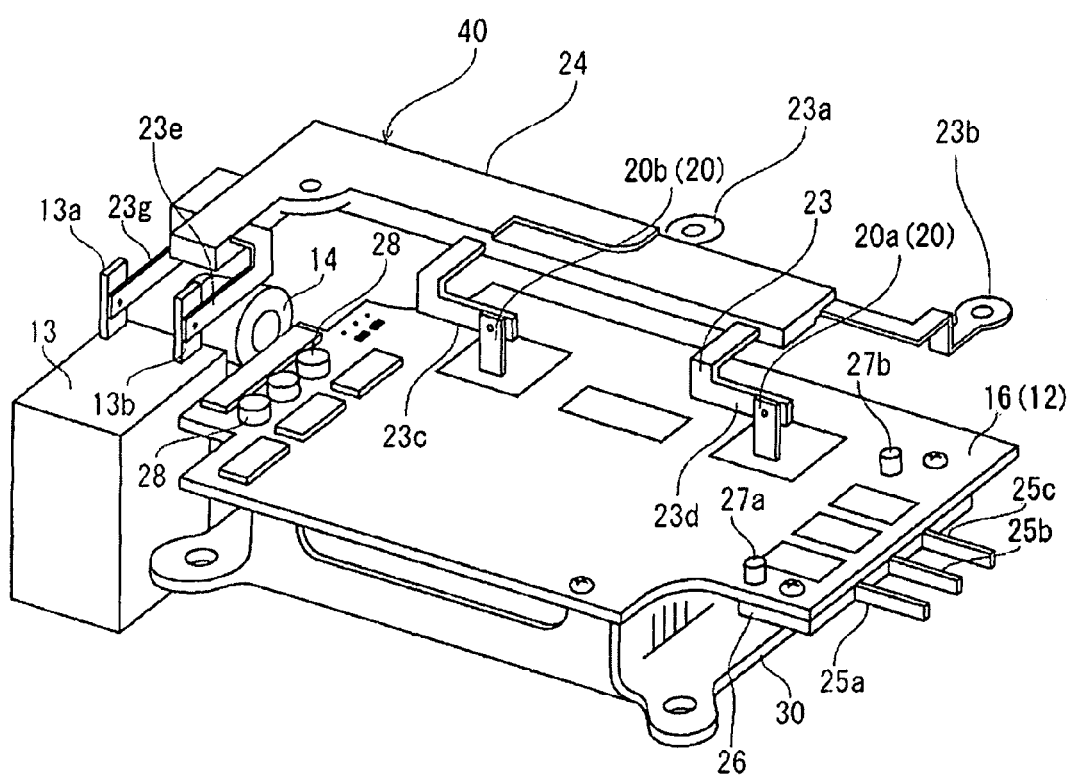
FIG. 3 is a view showing a state that a resistance element and a capacitor element are surface-mounted on the power board.

The switching element 18 is mounted to the power board 16 on a surface opposite to a side where the control circuit board 15 is located. Thus, a shield effect to noise generated at the switching element 18 and the like appears because of low impedance surfaces (layers) provided in the power board 16 and made of conductive materials such as a power supply frame, a GND frame and a GND layer. As a result, an influence of the noise on the control circuit board 15 is suppressed. Since a digital circuit such as a microcomputer driven by a low voltage is on the control circuit board 15, it is possible to prevent a malfunction of the microcomputer and the like by suppressing the noise from the switching element 18. Additionally, as shown in FIG. 3, a heat-dissipating plate 30 for dissipating heat of the switching element 18 is provided to the power board 16. The heat-dissipating plate 30 contacts the surface of the power board 16 having the switching element 18 mounted with a predetermined space apart from the switching element 18 and is provided thereto.

In the circuit configuration above, a power supply from the high voltage power supply to the power board 16 is performed through input/output terminals 20. The input/output terminals 20 are pin type PN terminals 20a and 20b mounted on the power board 16, as shown in FIGS. 1 and 3.

A bus bar (wiring for applying a voltage to the power board 16) 23 is connected from the high voltage power supply side to the PN terminals 20a and 20b so as to provide an electrical conduction. The bus bar 23 is provided to a periphery of the power board 16 (the control circuit board 15). The periphery means being within a plane of projection of the power board 16 (the control circuit board 15).

Additionally, tall components 28 (first tall components) such as transformers are surface-mounted on a surface of the power board 16 opposite to the surface having the switching element 18 provided. The tall components 28 are taller than any components surface-mounted on the surface having the switching element 18 provided (including the switching element 18).

Figure 4:
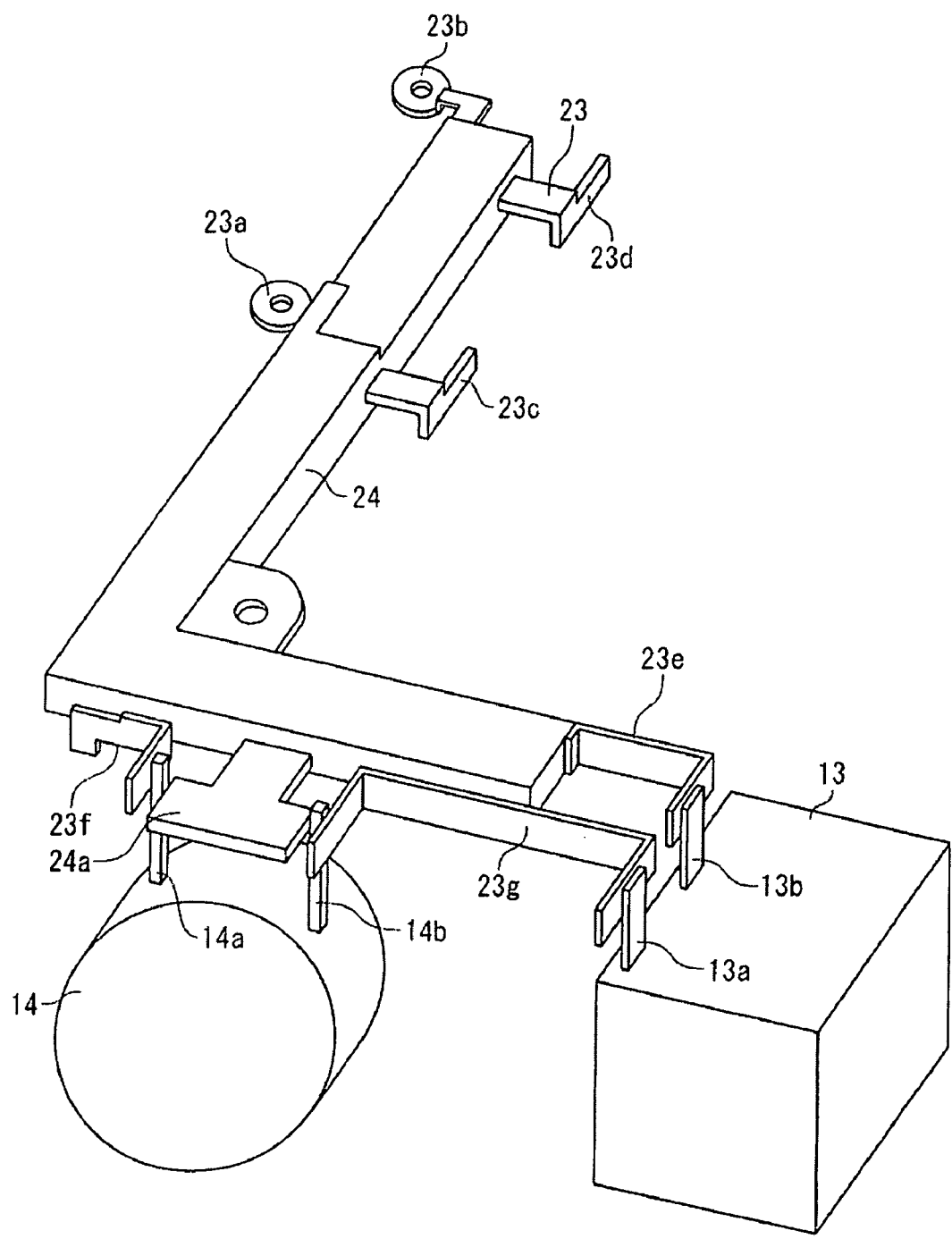
FIG. 4 is a view showing a unit including a capacitor, a reactor and a bus bar.

As shown in FIGS. 3 and 4, the capacitor 13 and the reactor 14 are unitized into the bus bar 23. Specifically, the bus bar 23 has power supply side terminal portions 23a and 23b connected to the high voltage power supply side, board side terminal portions 23c and 23d connected to the PN terminals 20a and 20b, a capacitor side terminal portion 23e connected to a terminal 13b of the capacitor 13, a reactor side terminal portion 23f connected to a terminal 14a of the reactor 14, and a joint portion 23g connecting a terminal 13a of the capacitor 13 and a terminal 14b of the reactor 14. The bus bar 23 connects the capacitor 13 and the reactor 14 so as to form the circuit configuration shown in FIG. 2. The bus bar 23, for example, can be made of copper with its cross section size on the order of 5 mm×1 mm.

The bus bar 23 is coated with a resin body 24 except the terminal portions. A substantially T-shaped support portion 24a is formed on the resin body 24 at joint parts of the terminals 14a, 14b of the reactor 14 and the reactor side terminal portion 23f, the joint portion 23g of the bus bar 23 so as to reinforce the joint parts.

The resin body 24 functions not only as an insulating member for preventing a short circuit between the bus bars 23 but also as a reinforcing member of the bus bar 23. Because of this, it is possible to handle a bus bar unit 40 having the bus bar 23, the capacitor 13 and the reactor 14 integrated with each other.

The capacitor 13 and the reactor 14 are previously welded to the capacitor side terminal portion 23e, the reactor side terminal portion 23f and the joint portion 23g of the bus bar 23. Then, the board side terminal portions 23c and 23d of the bus bar 23, and the PN terminals 20a and 20b are welded when the inverter control apparatus 12 is assembled.

Figure 5:
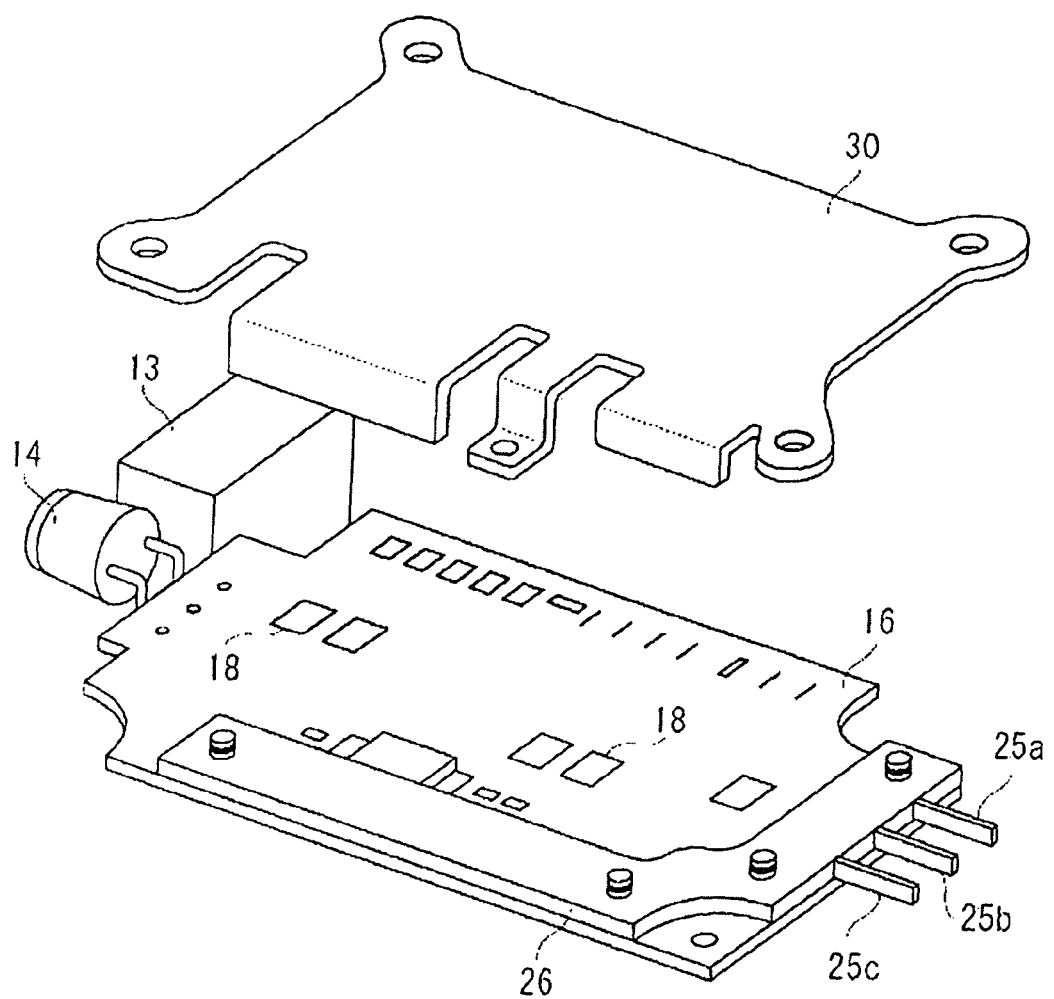
FIG. 5 is a view showing a configuration in which power is supplied from a power supply to the power board by the bus bar.

In the power board 16, the PN terminals 20a and 20b are formed of the bus bar 23. UVW terminals (wiring for supplying a current to respective phases of a polyphase motor) 25a, 25b and 25c for connecting the switching element 18 and the motor 19 are provided to the power board 16. These UVW terminals 25a, 25b and 25c are also formed of the bus bar 23. Then, as shown in FIG. 5, the PN terminals 20a and 20b, and the UVW terminals 25a, 25b and 25c are insulated each other and integrated by a resin body (insulator) 26.

The resin body 26 is provided to the power board 16 on a surface opposite to the surface having the bus bar 23 placed. As shown in FIG. 3, the PN terminals 20a and 20b whose proximal ends are held by the resin body 26 are provided so that their distal ends project to the side having the bus bar 23 placed through openings formed in the power board 16.

Additionally, projections (positioning means) 27a and 27b are formed close to the UVW terminals 25a, 25b and 25c in the resin body 26. Apertures are formed at locations corresponding to the projections 27a and 27b in the power board 16 and the projections 27a and 27b are inserted into the apertures. The projections 27a and 27b can easily and certainly position the bus bar unit 40 to the power board 16.

Figure 6:
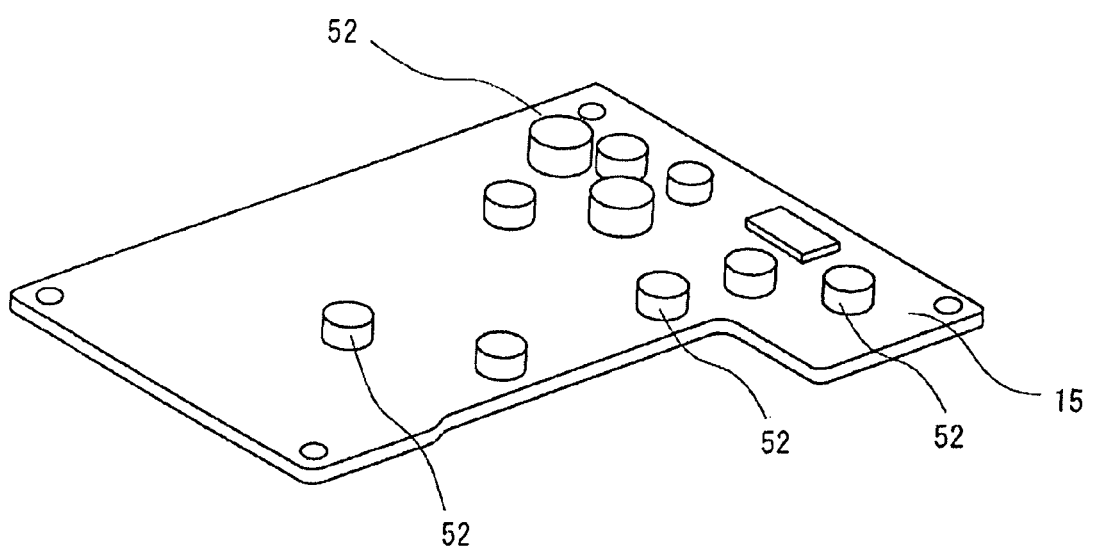
FIG. 6 is a perspective view seen from one surface of a control circuit board.
Figure 7:
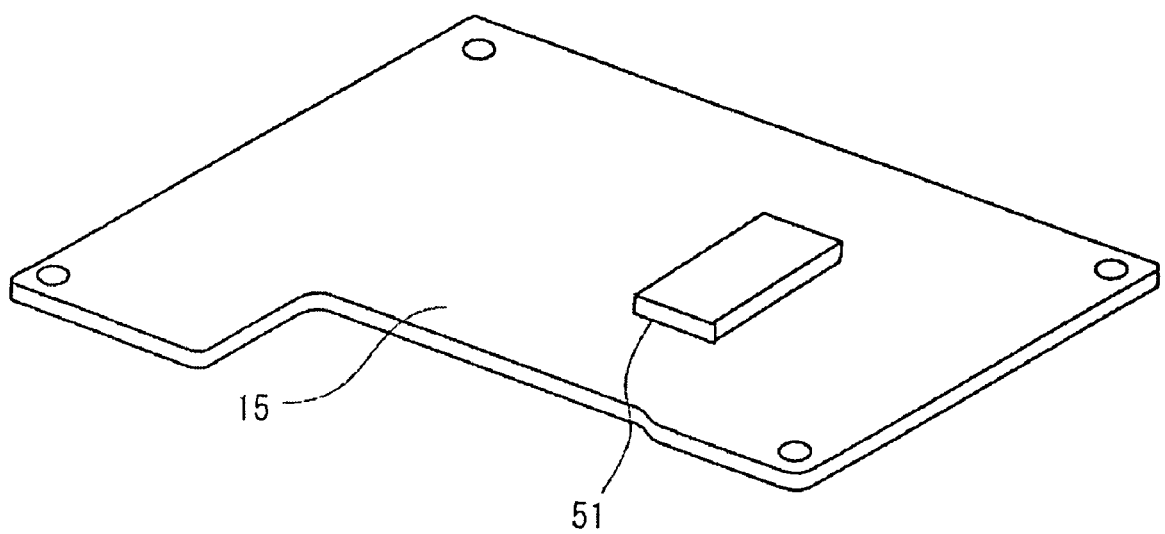
FIG. 7 is a perspective view seen from the other surface of the control circuit board.

FIG. 6 is a perspective view seen from one surface of the control circuit board 15 and FIG. 7 is a perspective view seen from the other surface side of the control circuit board 15. FIGS. 6 and 7 only show components whose sizes are comparatively large among the components surface-mounted.

As shown in FIG. 7, a CPU (Central Processing Unit) 51 of a microcomputer is surface-mounted on the other surface. The surface having the CPU 51 surface-mounted is a first surface and the opposite side of the first surface is a second surface. The CPU 51 is taller than the other components surface-mounted on the first surface. Also, as shown in FIG. 6, a plurality of tall components 52 such as transformers and field capacitors are surface-mounted on the second surface. As understood by comparing FIGS. 6 and 7, the tall components 52 (second tall components) are taller than the CPU 51.

Figure 8:
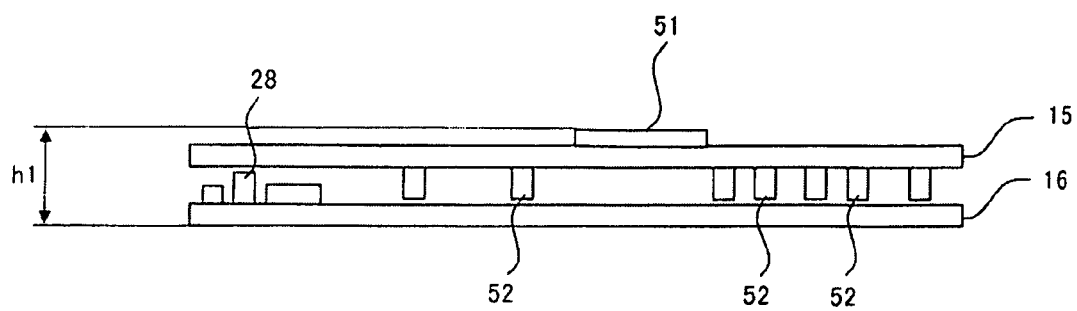
FIG. 8 is a view showing an arrangement relation between the control circuit board and the power board.
Figure 9:
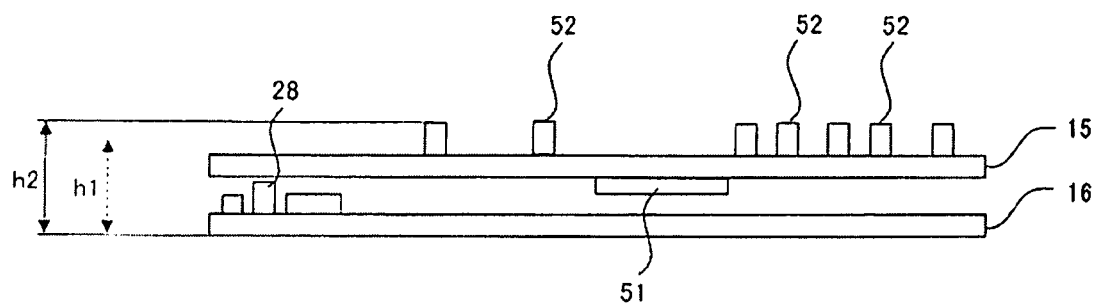
FIG. 9 is a view showing another arrangement relation between the control circuit board and the power board.

As described above, the control circuit board 15 is provided facing to the power board 16. In the embodiment, the control circuit board 15 and the power board 16 are provided so that the second surface of the control circuit board 15 and a surface of the power board 16 having the tall components 28 thereon are faced each other, as shown in FIG. 8. That is, the surfaces of the control circuit board 15 and the power board 16 having the tall components 52 and the tall components 28 respectively surface-mounted face each other. Here, the tall components 52 surface-mounted on the control circuit board 15 and the tall components 28 surface-mounted on the power board 16 do not interfere with each other. Do not interfere means that the tall components 52 and 28 are in a perpendicular direction to a plane direction of the control circuit board 15 or the power board 16 and in a direction to which the tall components 52 and 28 project. Accordingly, it is possible to lower a height in the case where the control circuit board 15 and the power board 16 are provided facing each other. On the other hand, when the first surface of the control circuit board 15 and the surface of the power board 16 having the tall components 28 thereon are provided facing each other, as shown in FIG. 9, a height in the case where the control circuit board 15 and the power board 16 are provided facing each other is higher than the height in the case of FIG. 8. Specifically, assume that a height from an under surface of the power board 16 to a top surface of the CPU 51 projecting on a top surface of the control circuit board 15 in the embodiment is h1, and a height from the under surface of the power board 16 to a top surface of the tall component 52 projecting on the top surface of the control circuit board 15 in the conventional example is h2, h1<h2 is derived.

In order to realize lowering a height like this in the embodiment, it is necessary to adjust locations where the tall components 52 are surface-mounted on the control circuit board 15 and the tall components 28 are surface-mounted on the power board 16. That is, a region where the tall components 52 are surface-mounted on the control circuit board 15 is a region where the tall components 28 are not surface-mounted on the power board 16 with the region facing to the power board 16. On the other hand, a region where the tall components 28 are surface-mounted on the power board 16 is a region where the tall components 52 are not surface-mounted on the control circuit board 15 with the region facing to the control circuit board 15. Designing the regions locating the tall components 28 and 52 can realize lowering the height of the inverter control apparatus 12.

The embodiment has an effect of reducing noise that the CPU 51 experiences in addition to lowering the height. It is apparent from the comparison of FIGS. 8 and 9 because the CPU 51 surface-mounted on the first surface of the control circuit board 15 is provided to a location further away from the power board 16.

According to the embodiment, the bus bar 23 is provided to the periphery of the power board 16 and the control circuit board 15, and between the power board 16 and the control circuit board 15. That is, the bus bar 23 does not project outside of the plane direction of the power board 16 and the control circuit board 15, and therefore, an outside diameter dimension of the inverter control apparatus 12 can be substantially reduced up to an outside diameter dimension of the power board 16 and the control circuit board 15.

Figure 10:
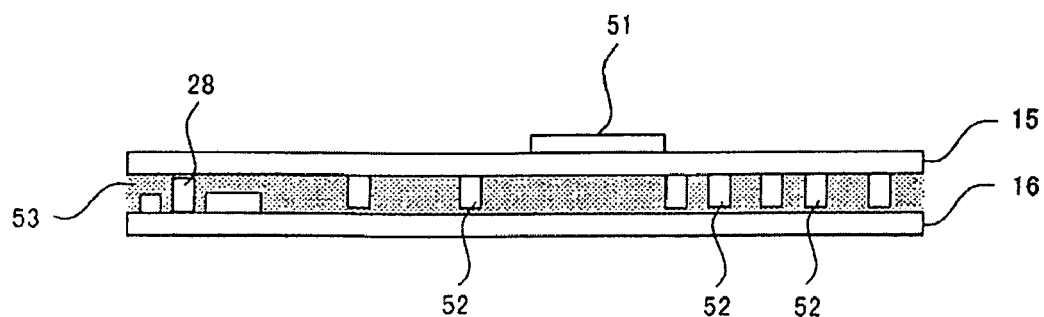
FIG. 10 is a view showing an example of filling a space between the control circuit board and the power board with insulating gel.

Considerable vibration is generated according to movement of the compressor in the vehicle-mounted electric compressor 10. As a matter of course, the vibration reaches the inverter control apparatus 12. As shown in the embodiment, if the tall components 52 surface-mounted on the control circuit board 15 are placed downward, it is preferable to have a configuration preventing the tall components 52 from dropping off due to the vibration. In the embodiment, as shown in FIG. 10, the space between the control circuit board 15 and the power board 16 is filled with insulating gel 53. Not only the space between the control circuit board 15 and the power board 16 but also whole internal space of the top container 11b of the housing 11 may be filled with the insulating gel 53. Silicone thermoset rubber, for example, is suitable for the insulating gel 53 for use.

In this manner, the space between the control circuit board 15 and the power board 16 is filled with the insulating gel 53 so that the insulating gel 53 absorbs the vibration, suppresses the vibration added to the control circuit board 15, and prevents the tall components 52 from dropping off from the control circuit board 15.

Insulation of electrical components including the tall components 52 is performed by filling with the insulating gel 53. Filling with the insulating gel 53 is also effective for damp-proofing. In particular, since inside of an engine room to which the electric compressor 10 is provided is under a circumstance with large temperature variation, drops of water are generated because of condensation when a temperature falls with high humidity. The drops of water such as condensation water cause troubles such as a short circuit of the electric components. However, covering the electric components with the insulating gel 53 waterproofs the electric components so as that the drops of water do not reach them.

Figure 11:
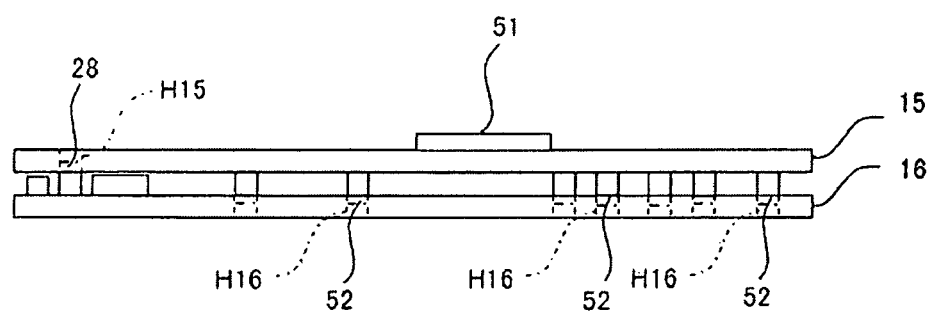
FIG. 11 is a view showing an arrangement relation between the control circuit board and the power board, which is an example of further lowering a height compared with FIG. 8.

Next, another embodiment capable of further lowering the height of the inverter control apparatus 12 is described with the FIG. 11.

As shown in FIG. 11, through-holes H15 are formed in the control circuit board 15. The through-holes H15 are formed at locations corresponding to the tall components 28 surface-mounted on the power board 16. The through-holes H15 are also formed in the control circuit board 15 in an area where elements of circuits such as electronic components and wiring do not exist.

Also, through-holes H16 are formed in the power board 16. The through-holes H16 are formed at locations corresponding to the tall components 52 surface-mounted on the control circuit board 15. The through-holes H16 are also formed in the power board 16 in an area where elements of circuits such as electronic components and wiring do not exist.

As shown in FIG. 11, distal ends of the tall components 28 surface-mounted on the power board 16 are inserted into the through-holes H15 of the control circuit board 15, while distal ends of the tall components 52 surface-mounted on the control circuit board 15 are inserted into the through-holes H16 of the power board 16. Accordingly, it is possible to further lower the height by a length of inserting the distal ends of the tall components 28 or the tall components 52.

What is claimed is:

1. An electric compressor comprising:
a compression mechanism taking in, compressing and discharging a refrigerant;
an electric motor driving the compression mechanism;
an inverter control apparatus controlling a drive of the electric motor; and
a housing accommodating the compression mechanism, the electric motor and the inverter control apparatus,
wherein the inverter control apparatus comprises:
a power board converting a direct current supplied from a high voltage power supply to an alternating current and applying it to the motor; and
a control circuit board controlling an application of the alternating current to the electric motor,
wherein the power board has a first tall component surface-mounted on one surface,
the first tall component is taller than a component on the other surface,
the control circuit board has a second tall component surface-mounted on one surface,
the second tall component is taller than a component on the other surface,
the one surface of the power board and the one surface of the control circuit board are placed facing each other,
the first tall component and the second tall component do not interfere with each other in projection directions thereof, and
wherein the first and second tall components are electronic components.

2. The electric compressor according to claim 1, wherein:
the control circuit board comprises a recess into which the first tall component is inserted at a location corresponding to the first tall component; and
the power board comprises a recess into which the second tall component is inserted at a location corresponding to the second tall component,
wherein a distal end of the first tall component is inserted into the recess in the control circuit board, and
a distal end of the second tall component is inserted into the recess in the power board.

3. The electric compressor according to claim 2, wherein the recess is a through hole or a blind hole.

4. The electric compressor according to claim 2, wherein a space between the power board and the control circuit board is filled with insulating gel.

5. The electric compressor according to claim 1, wherein a switching element including a plurality of Insulated Gate Bipolar Transistors is mounted to the power board on a surface opposite to a side where the control circuit board is located.

6. The electric compressor according to claim 1, wherein a Central Processing Unit is surface-mounted on the other surface of the control circuit board.

7. An electric compressor comprising:
a compression mechanism taking in, compressing and discharging a refrigerant;
an electric motor driving the compression mechanism;
an inverter control apparatus controlling a drive of the electric motor; and
a housing accommodating the compression mechanism, the electric motor and the inverter control apparatus,
wherein the inverter control apparatus comprises:
a power board converting a direct current supplied from a high voltage power supply to an alternating current and applying it to the motor; and
a control circuit board controlling an application of the alternating current to the electric motor,
wherein the power board has a first tall component surface-mounted on one surface,
the first tall component is taller than a component on the other surface,
the control circuit board has a second tall component surface-mounted on one surface,
the second tall component is taller than a component on the other surface,
the one surface of the power board and the one surface of the control circuit board are placed facing each other, and
the first tall component and the second tall component do not interfere with each other in projection directions thereof,
power supply wiring for applying a voltage from the high voltage power supply to the power board is formed of a bus bar fixed to the power board,
the bus bar is provided to a periphery of the power board and the control circuit board, and between the power board and the control circuit board, and
wherein the first and second tall components are electronic components.

8. The electric compressor according to claim 7, wherein:
the control circuit board comprises a recess into which the first tall component is inserted at a location corresponding to the first tall component; and
the power board comprises a recess into which the second tall component is inserted at a location corresponding to the second tall component,
wherein a distal end of the first tall component is inserted into the recess in the control circuit board, and
a distal end of the second tall component is inserted into the recess in the power board.

9. The electric compressor according to claim 8, wherein the recess is a through hole or a blind hole.

10. The electric compressor according to claim 8, wherein a space between the power board and the control circuit board is filled with insulating gel.

11. The electric compressor according to claim 7, wherein a switching element including a plurality of Insulated Gate Bipolar Transistors is mounted to the power board on a surface opposite to a side where the control circuit board is located.

12. The electric compressor according to claim 7, wherein a Central Processing Unit is surface-mounted on the other surface of the control circuit board.

13. An electric compressor comprising:
a compression mechanism taking in, compressing and discharging a refrigerant;
an electric motor driving the compression mechanism;
an inverter control apparatus controlling a drive of the electric motor; and
a housing accommodating the compression mechanism, the electric motor and the inverter control apparatus,
wherein the inverter control apparatus comprises:

a power board converting a direct current supplied from a high voltage power supply to an alternating current and applying it to the motor; and a control circuit board controlling an application of the alternating current to the electric motor, wherein the power board has a first tall component surface-mounted on one surface, the first tall component is taller than a component on the other surface, the control circuit board has a second tall component surface-mounted on one surface, the second tall component is taller than a component on the other surface, the one surface of the power board and the one surface of the control circuit board are placed facing each other, the first tall component and the second tall component do not interfere with each other in projection directions thereof, wherein a switching element including a plurality of Insulated Gate Bipolar Transistors is mounted to the power board on a surface opposite to a side where the control circuit board is located, and wherein a heat-dissipating plate for dissipating heat of the switching element contacts a surface of the power board on a side having the switching element mounted with a predetermined space apart from the switching element and is provided thereto.

14. An electric compressor comprising:

a compression mechanism taking in, compressing and discharging a refrigerant;

an electric motor driving the compression mechanism;

an inverter control apparatus controlling a drive of the electric motor; and a housing accommodating the compression mechanism, the electric motor and the inverter control apparatus, wherein the inverter control apparatus comprises:

a power board converting a direct current supplied from a high voltage power supply to an alternating current and applying it to the motor; and a control circuit board controlling an application of the alternating current to the electric motor, wherein the power board has a first tall component surface-mounted on one surface, the first tall component is taller than a component on the other surface, the control circuit board has a second tall component surface-mounted on one surface, the second tall component is taller than a component on the other surface, the one surface of the power board and the one surface of the control circuit board are placed facing each other, and the first tall component and the second tall component do not interfere with each other in projection directions thereof, power supply wiring for applying a voltage from the high voltage power supply to the power board is formed of a bus bar fixed to the power board, the bus bar is provided to a periphery of the power board and the control circuit board, and between the power board and the control circuit board, wherein a switching element including a plurality of Insulated Gate Bipolar Transistors is mounted to the power board on a surface opposite to a side where the control circuit board is located, and wherein a heat-dissipating plate for dissipating heat of the switching element contacts a surface of the power board on a side having the switching element mounted with a predetermined space apart from the switching element and is provided thereto.

* * * * *